(12) United States Patent
Koo et al.

(10) Patent No.: US 7,507,609 B2
(45) Date of Patent: *Mar. 24, 2009

(54) ORGANIC ELECTROLUMINESCENT DISPLAY AND METHOD OF MANUFACTURING THE SAME

(75) Inventors: Jae-Bon Koo, Yongin (KR); Sang-Il Park, Seoul (KR)

(73) Assignee: Samsung Mobile Display Co., Ltd., Suwon-si (KR)

( * ) Notice: Subject to any disclaimer, the term of this patent is extended or adjusted under 35 U.S.C. 154(b) by 401 days.

This patent is subject to a terminal disclaimer.

(21) Appl. No.: 11/219,676

(22) Filed: Sep. 7, 2005

(65) Prior Publication Data

US 2006/0019573 A1    Jan. 26, 2006

Related U.S. Application Data

(60) Division of application No. 11/116,219, filed on Apr. 28, 2005, now Pat. No. 7,034,455, which is a continuation of application No. 10/663,800, filed on Sep. 17, 2003, now Pat. No. 6,917,160.

(30) Foreign Application Priority Data

Sep. 19, 2002    (KR) .............................. 2002-57336

(51) Int. Cl.
*H01L 21/00* (2006.01)
*H01L 21/84* (2006.01)

(52) U.S. Cl. ................... 438/149; 438/479; 313/506

(58) Field of Classification Search ............... 438/29, 438/30, 34, 69, 82, 149, 479, 780; 349/42–43, 349/149, 152; 313/504, 506
See application file for complete search history.

(56) References Cited

U.S. PATENT DOCUMENTS

| 6,160,272 | A  | * | 12/2000 | Arai et al. ................... 257/72 |
| 6,538,374 | B2 |   | 3/2003  | Hosokawa |
| 6,917,160 | B2 | * | 7/2005  | Koo et al. ................... 313/506 |
| 7,045,861 | B2 |   | 5/2006  | Takayama et al. |
| 2003/0048072 | A1 | * | 3/2003 | Ishihara et al. ............ 313/506 |

FOREIGN PATENT DOCUMENTS

CN        1450841 A        10/2003

(Continued)

OTHER PUBLICATIONS

Office Action issued in Japanese Patent Application No. 2003-282968 on Jul. 24, 2007.

(Continued)

*Primary Examiner*—Thien F Tran
(74) *Attorney, Agent, or Firm*—Stein, McEwen & Bui, LLP

(57) ABSTRACT

An organic electroluminescent display and a method of manufacturing the same are provided. The organic electroluminescent display includes a substrate, at least a thin-film transistor, which is formed on the substrate, at least an insulation layer, which cover the thin-film transistor, first electrodes, which are formed in a predetermined pattern on a top surface of the insulation layer and to which a voltage is selectively applied through the thin-film transistor, bus electrodes, which are insulated from the first electrodes, a planarization layer, which is an insulation layer and has openings exposing the first electrodes and the bus electrodes, organic layers, which are formed on a top surface of the first electrodes, and second electrodes, which are formed on a top surface of the organic layer and a top surface of the planarization layer and are electrically connected to the bus electrodes.

17 Claims, 4 Drawing Sheets

FOREIGN PATENT DOCUMENTS

| | | |
|---|---|---|
| EP | 1 349 208 | 1/2003 |
| JP | 62-172691 | 7/1987 |
| JP | 63-172691 | 7/1988 |
| JP | 64-15982 | 1/1989 |
| JP | 1-220394 | 9/1989 |
| JP | 11-283751 | 10/1999 |
| JP | 2001-230086 | 8/2001 |
| JP | 2002-318556 | 10/2002 |
| JP | 2003-59660 | 2/2003 |
| JP | 2003-84683 | 3/2003 |
| JP | 2004-14366 | 1/2004 |
| JP | 2004-71365 | 3/2004 |

OTHER PUBLICATIONS

Office Action issued by Patent Office of the People's Republic of China in Chinese Patent Application No. 03151488.X on Jan. 19, 2007.

U.S. Appl. No. 11/116,219, filed Apr. 28, 2005, Jae-Bon Koo et al., Samsung SDI Co., Ltd.

U.S. Appl. No. 10/663,800, filed Sep. 17, 2003, Jae-Bon Koo et al., Samsung SDI Co., Ltd.

* cited by examiner

ORGANIC ELECTROLUMINESCENT DISPLAY AND METHOD OF MANUFACTURING THE SAME

CROSS-REFERENCE TO RELATED APPLICATIONS

This application is a divisional application of Ser. No. 11/116,219, filed Apr. 28, 2005, now U.S. Pat. No. 7,034,455 which is a continuation of Ser. No. 10/663,800 filed Sep. 17, 2003, now U.S. Pat. No. 6,917,160, and claims the priority of Korean Patent Application No. 2002-57336, filed on Sep. 19, 2002, in the Korean Intellectual Property Office, the disclosure of which is incorporated herein by reference.

BACKGROUND OF THE INVENTION

1. Field of the Invention

The present invention relates to an organic electroluminescent display, and more particularly, to an organic electroluminescent display with an improved electrode structure.

2. Description of the Related Art

Generally, organic electroluminescent displays are self-luminescent displays which emit light by electrically exciting a fluorescent organic compound. They can be operated with low voltage and can be made thin. In addition, organic electroluminescent displays have advantages, such as a wide viewing angle and a fast response speed, that overcome the problems of liquid crystal displays. Accordingly, they have been noted as next generation displays.

In such organic electroluminescent displays, an organic layer is formed in a predetermined pattern on a substrate made of glass or other transparent materials, and electrode layers are disposed under and below the organic layers.

In organic electroluminescent displays having the above-described structure, when positive and negative voltages are applied to the electrodes, holes are moved from an electrode, to which a positive voltage is applied, to a luminescent layer via a hole transport layer. Electrons are moved from an electrode, to which a negative voltage is applied, to the luminescent layer via an electron transport layer. The electrons meet the holes in the luminescent layer, thereby generating excitons. The excitons make transitions from an excitation state to a ground state, thereby provoking fluorescent molecules of the luminescent layer to emit light. As a result, an image is formed.

The light efficiency of organic electroluminescent displays operating as described above is divided into internal efficiency and external efficiency. The internal efficiency depends on the photoelectric conversion efficiency of an organic luminescent material. The external efficiency is referred to as light coupling efficiency and depends on the refractivity of each of layers included in an organic electroluminescent display. Organic electroluminescent displays have lower external efficiency than other displays such as cathode-ray tubes and plasma display panels (PDPs). Accordingly, such organic electroluminescent displays need to be improved in terms of characteristics of displays, such as brightness and a life span.

In the meantime, in organic electroluminescent displays having the above-described structure, as the size of a panel increases, the line resistance of an electrode increases, which causes the brightness of an image to be nonuniform. In particular, when an organic electroluminescent display is driven by a thin-film transistor, the line resistance of a cathode increases, and thus the above problem occurs.

Japanese Patent Publication Nos. sho 62-172691, sho 63-172691, hei 1-220394, and hei 11-283751 disclose conventional organic electroluminescent displays. These conventional organic electroluminescent displays are not provided with an element for reducing the line resistance of a cathode and thus still have a problem of nonuniform brightness of an image due to the line resistance.

SUMMARY OF THE INVENTION

The present invention provides an organic electroluminescent display for reducing the line resistance of an electrode so that the brightness of an image can be prevented from being nonuniform due to the line resistance.

The present invention also provides an organic electroluminescent display, in which a bus electrode for reducing the line resistance of a cathode is formed in a simple structure, thereby reducing manufacturing cost.

According to an aspect of the present invention, there is provided an organic electroluminescent display comprising a substrate, at least a thin-film transistor, which is formed on the substrate, at least an insulation layer, which cover the thin-film transistor, first electrodes, which are formed in a predetermined pattern on a top surface of the insulation layer and to which a voltage is selectively applied through the thin-film transistor, bus electrodes, which are insulated from the first electrodes, a planarization layer, which is an insulation layer and has openings exposing the first electrodes and the bus electrodes, organic layers, which are formed on a top surface of the first electrodes, and second electrodes, which are formed on a top surface of the organic layer and a top surface of the planarization layer and are electrically connected to the bus electrodes. The second electrodes are made of a transparent material. Thus, the organic electroluminescent display is very effective when the second electrodes are applied to a structure in which light is discharged through a front side. The first electrodes and the bus electrodes are made of the same material. The bus electrodes are formed on a top surface of the insulation layer. Light emitted from the organic layers may be discharged in a direction of the second electrodes According to another aspect of the present invention, there is also provided a method of manufacturing an organic electroluminescent display, the method comprising, forming at least a thin-film transistor on a top surface of a substrate, forming at least an insulation layer on a top surface of the thin-film transistor, forming first electrodes, to which a potential is selectively applied through the thin-film transistor, and bus electrodes, which are electrically insulated from the first electrodes on a top surface of the insulation layer, forming a planarization layer on a top surface of the insulation layer to have openings at positions corresponding to the first electrodes and the bus electrodes, forming organic layers on a top surface of the first electrodes, and forming second electrodes on a top surface of the planarization layer and a top surface of selected organic layers and are electrically connected to the bus electrodes.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
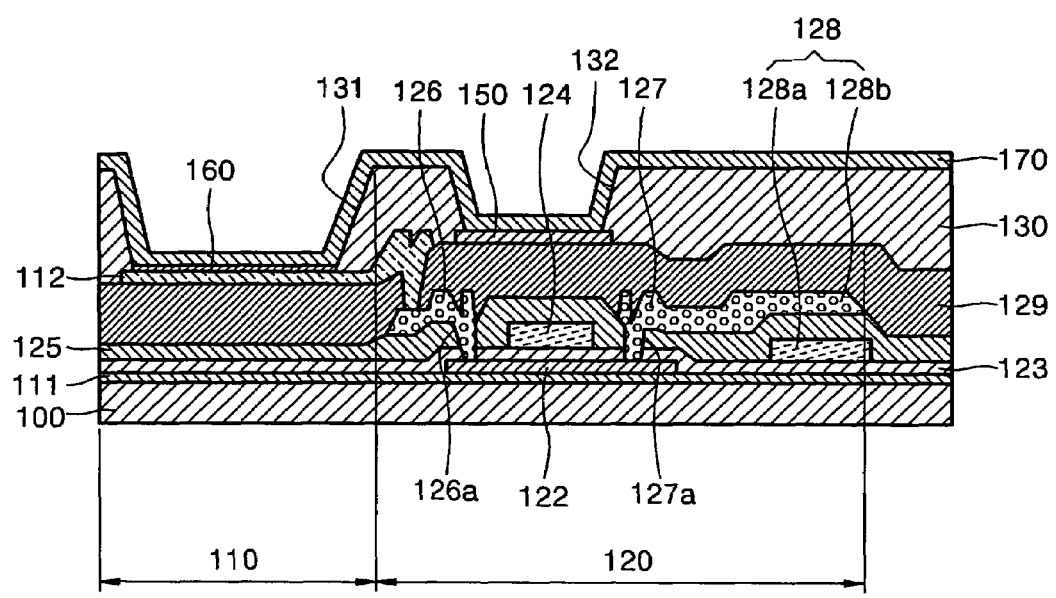
FIG. 1 is a cross-section of an organic electroluminescent display according to an embodiment of the present invention.

Reference will now be made in detail to the embodiments of the present invention, examples of which are illustrated in the accompanying drawings, wherein like reference numerals refer to the like elements throughout. The embodiments are described below in order to explain the present invention by referring to the figures.

FIG. 1 shows an example of an active matrix organic light emitting display (AMOLED), as an organic electroluminescent display according to an embodiment of the present invention. Referring to FIG. 1, a buffer layer 111 is formed on a top surface of a transparent substrate 100. The organic electroluminescent display shown in FIG. 1 is largely divided into a pixel formation section 110, which includes a first electrode 112 for forming a pixel above the buffer layer 111, and a driving section 120, which drive electrodes of the pixel formation section 110 using thin-film transistors (TFTs) and capacitors.

The driving section 120 includes TFTs and capacitors, which are formed on the buffer 111. The TFT includes a P or N type semiconductor layer 122, which is formed in a predetermined pattern on a top surface of the buffer 111; a gate insulation layer, i.e., a first insulation layer 123, which covers the semiconductor layer 122; a gate electrode layer 124, which is formed on a top surface of the first insulation layer 123 so as to correspond to the semiconductor layer 122; a second insulation layer 125, which covers the gate electrode layer 124; and a drain electrode 126 and a source electrode 127, which are formed on the second insulation layer 125 and respectively connected to both ends of the semiconductor layer 122 through contact holes 126a and 127a penetrating the second insulation layer 125 and the first insulation layer 123. The capacitor 128 includes a first auxiliary electrode 128b, which are formed on a top surface of the second insulation layer 125 and connected to the source electrode 127, and a second auxiliary electrode 128a, which is covered with the second insulation layer 125 so as to correspond to the first auxiliary electrode 128b. A third insulation layer 129 is formed on a top surface of the second insulation layer 125 to cover the drain electrode 126 and the source electrode 127.

Here, the shapes of the first, second, and third insulation layers 123, 125, and 129 can vary with a state of the TFT. In addition, the number of the first, second, and third insulation layers 123, 125, and 129 can be reduced, and they are made of a transparent material. And numbers of the TFT and the capacitor may be varied.

In the meantime, the pixel formation section 110 includes the first electrode 112, which is formed on a top surface of the third insulation layer 129 stacked on the transparent substrate 100 and is electrically connected to the drain electrode 126. A bus electrode 150 is formed in a predetermined pattern on a top surface of the third insulation layer 129 to be electrically insulated from the first electrode 112.

A planarization layer 130, i.e., a fourth insulation layer, is formed on an entire surface of the third insulation layer 129 on which the first electrode 112 and the bus electrode 150 are formed. The planarization layer 130 has a first opening 131, which exposes a part of the first electrode 112, and a second opening 132, which exposes a part of the bus electrode 150. An organic layer 160 is formed on a top surface of the first electrode 112 exposed through the first opening 131. A second electrode 170 is formed on the organic layer 160 and the planarization layer 130 to be electrically connected to the bus electrode 150. Here, the first electrode 112 and the bus electrode 150 are made of the same material. It is preferable that the bus electrode 150 is formed in a predetermined pattern so as to reduce the line resistance of the second electrode 170.

In an organic electroluminescent display having the above-described structure according to the present invention, when a predetermined voltage is applied to the first electrode 112 through the driving section 120, a voltage is applied to the second electrode 170. Then, holes move from the first electrode 112 to a luminescent layer of the organic layer 160, and electrons move from the second electrode 170 to the luminescent layer. The electrons meet the holes in the luminescent layer, thereby generating excitons. The excitons make transitions from an excitation state to a ground state, thereby provoking fluorescent molecules of the luminescent layer to emit light. The emitted light is discharged through a front side (when the second electrode 170 is made of a transparent material) or a rear side.

In the above-described procedure, since the second electrode 170 is electrically connected to the bus electrode 150 having a predetermined pattern, current and voltage flowing through the second electrode 170 can be prevented from dropping. Due to this prevention of the drop of voltage and current, current and voltage for exciting the organic layer 160 positioned between the first and second electrodes 112 and 170 can be maintained constant. As a result, the brightness of an image can be fundamentally prevented from being non-uniform throughout the image.

FIGS. 2 through 7 are cross-sections of stages in a method of manufacturing an organic electroluminescent display having the above-described structure, according to an embodiment of the present invention.

Figure 2:
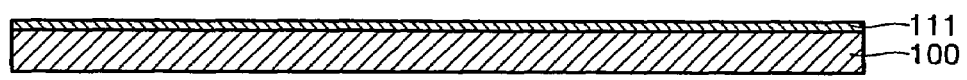
FIGS. 2 through 7 are cross-sections of stages in a method of manufacturing an organic electroluminescent display according to an embodiment of the present invention.
Figure 3:
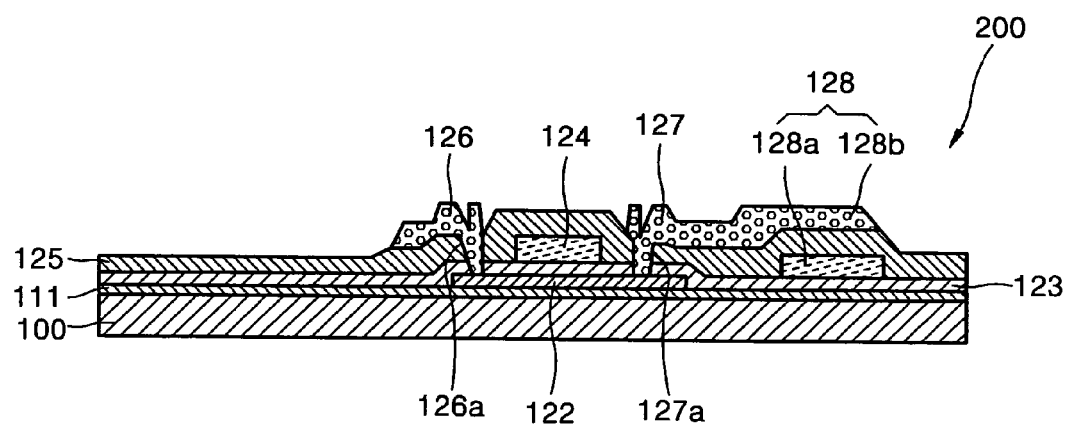

Referring to FIGS. 2 and 3, the buffer layer 111 is formed on a top surface of the transparent substrate 100, and then at least a TFT layer 200 is formed on a top surface of the buffer layer 111. The TFT layer 200 can be formed by a typical method, and thus detailed description thereof will be omitted.

Figure 4:
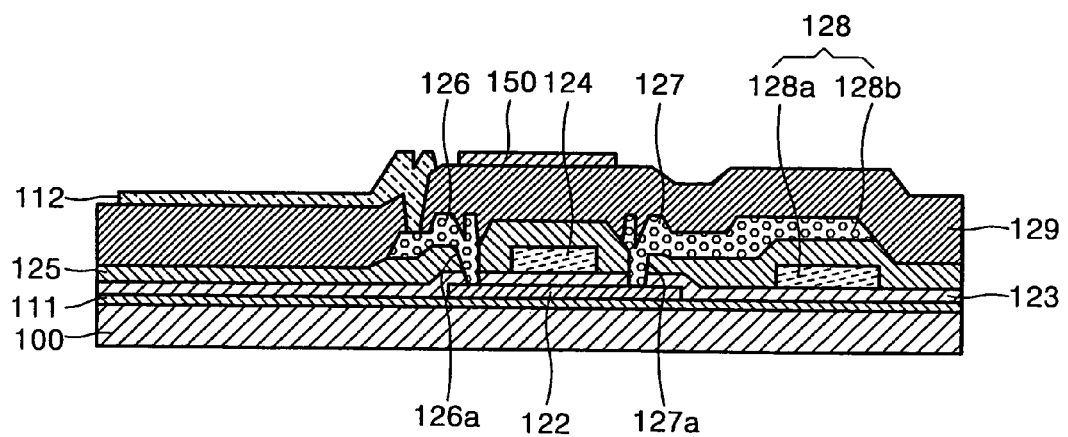

Referring to FIG. 4, after completion of the TFT layer 200, the third insulation layer 129 is formed on a top surface of the TFT layer 200. The first electrode 112, to which a potential is selectively applied through the TFT layer 200, and the bus electrode 150, which is electrically insulated from the first electrode 112, are formed on a top surface of the third insulation layer 129. Here, the first electrode 112 and the bus electrode 150 are formed by bringing an evaporation mask (not shown), which has a pattern for the first electrode 112 and a pattern for the bus electrode 150, into close contact with the third insulation layer 129 and evaporating a material for the first electrode 112 and a material for the bus electrode 150. Since the first electrode 112 and the bus electrode 150 can be made of the same material, they can be simultaneously formed through evaporation. The formation of the first electrode 112 and the bus electrode 150 is not restricted to the above-described embodiment, but any method enabling the first electrode 112 and the bus electrode 150 to be formed simultaneously can be used.

Figure 5:
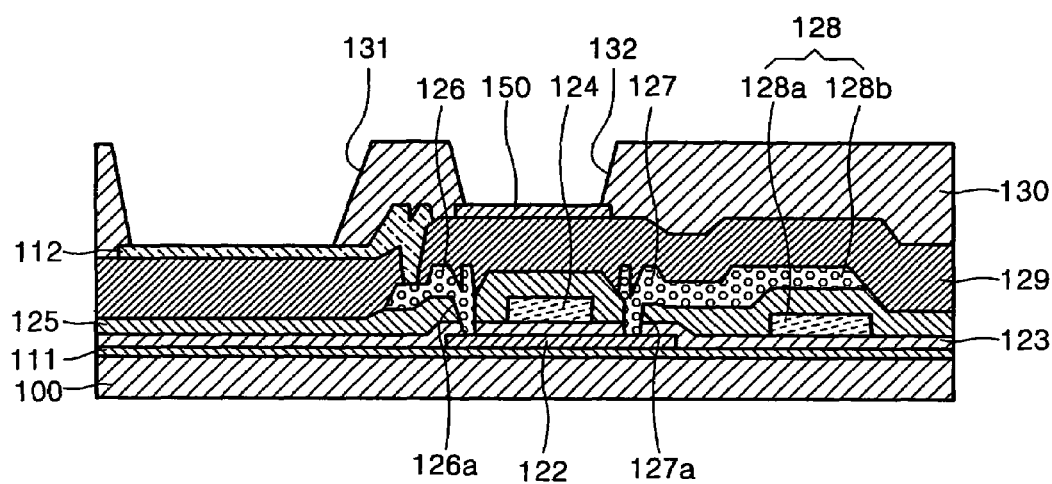
Figure 6:
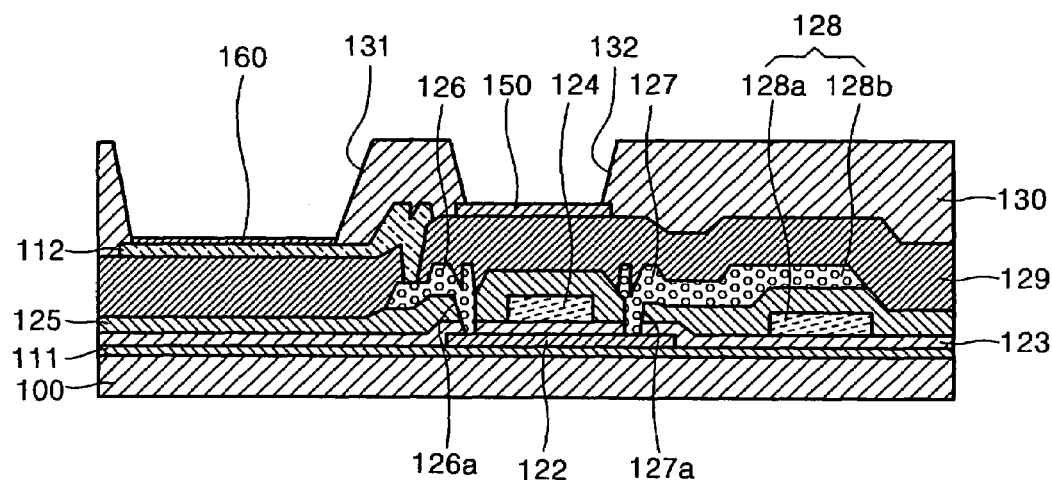

As shown in FIGS. 5 and 6, the planarization layer 130, i.e., the fourth insulation layer, having the first and second openings 131 and 132 at positions respectively corresponding to the first electrode 112 and the bus electrode 150, are formed on the third insulation layer 129. The organic layer 160 is formed on a top surface of the first electrode 112.

Figure 7:
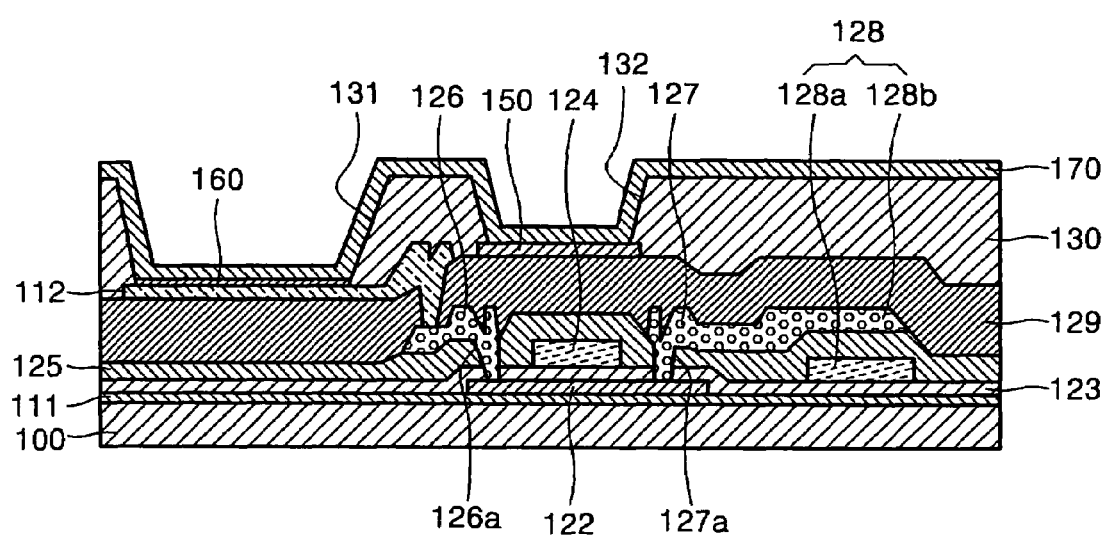

As shown in FIG. 7, the second electrode 170 is formed in a predetermined pattern on a top surface of the planarization layer 130 and a top surface of the organic layer 160 to be electrically connected to the bus electrode 150. The second electrode 170 is formed by bringing a mask having the pattern of the second electrode into close contact with the planarization layer 130 having the first and second openings 131 and 132 and performing evaporation.

As described above, line resistance, which increases with an increase in the size of an organic electroluminescent display, is reduced, where a bus electrode electrically connected to a second electrode is formed on a top surface of an insulation layer having a first electrode, thereby accomplishing uniform brightness of an image.

Although a few embodiments of the present invention have been shown and described, it will be appreciated by those skilled in the art that changes may be made in these elements without departing from the principles and spirit of the invention, the scope of which is defined in the appended claims and their equivalents.

What is claimed is:

1. A method of manufacturing an organic electroluminescent display, the method comprising:
    forming a thin-film transistor on a top surface of a substrate;
    forming an insulation layer on a top surface of the thin-film transistor;
    forming a first electrode on a top surface of the insulation layer, that is extended to the thin-film transistor;
    forming a bus electrode on the top surface of the insulation layer, that is disposed over the thin-film transistor and is electrically insulated from the first electrode;
    forming a planarization layer on the top surface of the insulation layer to have openings exposing the first electrode and the bus electrode;
    forming an organic layer on a top surface of the first electrode; and
    forming a second electrode on a top surface of the organic layer and a top surface of the planarization layer, that is electrically connected to the bus electrode.

2. The method of claim 1, wherein the second electrode is made of a transparent material.

3. The method of claim 1, wherein the first electrode and the bus electrode are made of a same material.

4. The method of claim 3, wherein the first electrode and the bus electrode are made of metal.

5. The method of claim 1, wherein the forming of the first electrode and the forming of the bus electrode are performed simultaneously.

6. The method of claim 1, wherein the bus electrode is formed on a top surface of the insulation layer.

7. The method of claim 1, wherein light emitted from the organic layer is discharged in a direction of the second electrode.

8. The method of claim 1, wherein the planarization layer further has an opening exposing the bus electrode.

9. The method of claim 1, wherein the second electrode is formed on a top surface of the planarization layer.

10. The method of claim 1, wherein the second electrode is directly in contact with the bus electrode.

11. A method for forming an organic electroluminescent display comprising:
    forming a thin-film transistor on a substrate, the thin-film transistor having a semiconductor layer disposed on the substrate over a channel region, a drain electrode and a source electrode extended from respective ends of the semiconductor layer, and a gate electrode disposed between the drain and source electrodes and formed over the semiconductor layer;
    forming an insulation layer to cover the thin-film transistor, insulating the semiconductor layer, the drain electrode, the source electrode and the gate electrode;
    forming a first electrode on the insulation layer, that is electrically connected to the drain electrode of the thin-film transistor to which a voltage is selectively applied thereto;
    forming a bus electrode on the insulation layer over the channel region;
    forming a planarization layer having openings exposing the first electrode and the bus electrode;
    forming an organic layer formed on a top surface of the first electrode; and
    forming a second electrode on a top surface of the organic layer and a top surface of the planarization layer, that is electrically connected to the bus electrode.

12. The method of claim 11, wherein the second electrode is made of a transparent material.

13. The method of claim 11, wherein the first electrode and the bus electrode are made of the same material.

14. The method of claim 11, wherein light emitted from the organic layer is discharged in a direction of the second electrode.

15. A method for forming an organic electroluminescent display, the method comprising:
    forming a thin-film transistor on a substrate, the thin-film transistor having a semiconductor layer disposed on the substrate over a channel region, a drain electrode and a source electrode extended from respective ends of the semiconductor layer, and a gate electrode disposed between the drain and source electrodes and formed over the semiconductor layer;
    forming an insulation layer on the substrate to cover the thin-film transistor;
    forming a first electrode on the insulation layer extending to the thin-film transistor so as to be electrically connected to one of the drain and source electrodes of the thin-film transistor;
    forming a bus electrode on the insulation layer, disposed over the channel region of the thin-film transistor;
    forming a planarization layer having openings exposing the first electrode and the bus electrode;
    depositing an organic layer on the first electrode exposed in the opening of the planarization layer; and
    forming a second electrode on a surface of the organic layer and the planarization layer, including the bus electrode exposed in the opening of the planarization layer,
    wherein the first electrode and the organic layer are formed in a pixel forming section of the organic electroluminescent display where light is emitted, and
    wherein the thin-film transistor and the bus electrode are formed in a driving section of the organic electroluminescent display where light emission is driven.

16. The method of claim 15, wherein the second electrode is made of a transparent material.

17. The method of claim 15, wherein the first electrode and the bus electrode are made of the same material.

* * * * *